(12) United States Patent
Prokop et al.

(10) Patent No.: US 9,660,623 B1
(45) Date of Patent: May 23, 2017

(54) ANALOG CORRELATOR BASED ON ONE BIT DIGITAL CORRELATOR

(71) Applicant: The United States of America as represented by the Administrator of the National Aeronautics and Space Administration, Washington, DC (US)

(72) Inventors: Norman Prokop, South Euclid, OH (US); Michael Krasowski, Chagrin Falls, OH (US)

(73) Assignee: The United States of America as Represented by the Administrator of National Aeronautics and Space Administration, Washington, DC (US)

( * ) Notice: Subject to any disclaimer, the term of this patent is extended or adjusted under 35 U.S.C. 154(b) by 372 days.

(21) Appl. No.: 14/094,006

(22) Filed: Dec. 2, 2013

Related U.S. Application Data

(60) Provisional application No. 61/731,896, filed on Nov. 30, 2012.

(51) Int. Cl.
*H03K 5/125* (2006.01)
*G06F 17/15* (2006.01)

(52) U.S. Cl.
CPC ............. *H03K 5/125* (2013.01); *G06F 17/15* (2013.01)

(58) Field of Classification Search
CPC .................................. G06F 17/15; G06F 17/153
See application file for complete search history.

(56) References Cited

U.S. PATENT DOCUMENTS

| | | | | |
|---|---|---|---|---|
| 3,903,405 A * | 9/1975 | Gaskill, Jr. | ............. | G06F 17/15 708/424 |
| 4,660,164 A * | 4/1987 | Leibowitz | ............... | G06F 17/15 375/E1.003 |
| 5,022,047 A * | 6/1991 | Dixon | .................. | H04B 1/7093 375/142 |
| 5,239,496 A * | 8/1993 | Vancraeynest | .......... | G06F 17/15 375/130 |
| 5,305,245 A * | 4/1994 | Kurihara | .................. | G06F 17/15 708/250 |
| 5,687,190 A * | 11/1997 | Tsao | ........................ | H04B 1/707 375/142 |
| 6,118,808 A * | 9/2000 | Tiemann | ............... | G01S 5/0027 375/142 |

* cited by examiner

*Primary Examiner* — Chuong D Ngo
(74) *Attorney, Agent, or Firm* — Robert H. Earp, III

(57) ABSTRACT

A two input time domain correlator may perform analog correlation. In order to achieve high throughput rates with reduced or minimal computational overhead, the input data streams may be hard limited through adaptive thresholding to yield two binary bit streams. Correlation may be achieved through the use of a Hamming distance calculation, where the distance between the two bit streams approximates the time delay that separates them. The resulting Hamming distance approximates the correlation time delay with high accuracy.

17 Claims, 6 Drawing Sheets

ANALOG CORRELATOR BASED ON ONE BIT DIGITAL CORRELATOR

CROSS REFERENCE TO RELATED APPLICATION

This application is a non-provisional of, and claims priority to, U.S. Provisional Patent Application Ser. No. 61/731,896 filed Nov. 30, 2012. The subject matter of this earlier-filed application is hereby incorporated by reference in its entirety.

ORIGIN OF THE INVENTION

The invention described herein was made by employees of the United States Government and may be manufactured and used by or for the Government for Government purposes without the payment of any royalties thereon or therefore.

The invention described herein was also made in the performance of work under a NASA contract and is subject to the provisions of Section 305 of the National Aeronautics and Space Action of 1958, Public Law 85-568 (72 Stat. 435; 42 U.S.C. 2457).

FIELD

The present invention generally pertains to time domain correlation, and more specifically, to analog correlation by converting an analog signal into a one bit digital stream and then performing correlation on the stream using bit counter Hamming distance calculation hardware.

BACKGROUND

There are many problems where two signals are correlated, but have a distinct time delay between them. One example is a flow sensor consisting of two individual sensor channels that are spatially separated and positioned perpendicular to the airflow. In this sensor, the signals produced by the two individual sensor channels are correlated, meaning that the spatial distance between them is small enough that perturbations in the first signal are statistically present in the second signal, but there is a time delay between the two signals. This time delay is proportional to the air flow speed over the sensor.

Calculation of this time delay is traditionally accomplished by performing a correlation function, which results in the final output of the flow speed. This correlation is conventionally achieved using an analog-to-digital converter sampling system and digital signal processor optimized to perform the calculations required of the correlation function. This function requires many multiplications and additions, which is very processing heavy and is sometimes not feasible at the desired sampling rate.

Often, and perhaps most importantly, the requisite processing hardware for conventional analog correlation is relatively advanced, and has significant mass and volume. Such processing hardware also takes significant time to process the signals and has significant power requirements, sometimes on the order of 2-3 Watts or more. These constraints have precluded the use of analog correlation functions in many target applications. Accordingly, analog correlation hardware that is small, low power, and fast may be beneficial. It may also be beneficial for such analog correlation to be optimized for field programmable gate arrays (FPGAs) that are often represented by radiation hardened and high temperature technologies. Such optimization opens up the opportunity for sensors requiring time domain correlation to be embedded into critical and harsh environments.

SUMMARY

Certain embodiments of the present invention may be implemented and provide solutions to the problems and needs in the art that have not yet been fully solved by conventional analog correlation technologies. For example, in some embodiments, analog correlation is achieved by converting an analog signal into a one bit digital stream and then performing correlation on the stream using bit counter Hamming distance calculation hardware. Such embodiments may be particularly beneficial for wind sensors used in planetary science and for gas flow sensing in turbine engines, for example.

In one embodiment of the present invention, a hardware-implemented method includes loading, by a processor, newest sample values from two channels into each channel's respective linear shift register, A and B. The hardware-implemented method also includes clocking out, by the processor, an oldest sample from each of the linear shift registers and clocking the newest sample values. The hardware-implemented method further includes performing, by the processor, a one bit correlation for each of a number N of bits in the linear shift registers.

In another embodiment of the present invention, an apparatus includes two linear shift registers A and B configured to receive two different time delayed signals. The apparatus also includes a Hamming distance calculator configured to calculate a Hamming distance by performing a bitwise exclusive NOR (XNOR) function on the A and B registers and place a result having a number of bits N of the A and B registers in a C register. The apparatus further includes a bit counter configured to count a number of bits with a same value in the C register to determine a Hamming similarity between registers A and B.

In yet another embodiment of the present invention, a processor includes a bit counter configured to count a number of same-valued bits in a register, wherein the bit counter comprises at least one half adder and zero or more full adders, the number of half adders and full adders given by $$1 \text{ Half Adder} + \sum_{i=1}^{\log_2(N)-1} (i * \text{Full Adders} + \text{Half Adder})$$

where N is a number of bits to be counted by the bit counter.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE EMBODIMENTS

Figure 1:
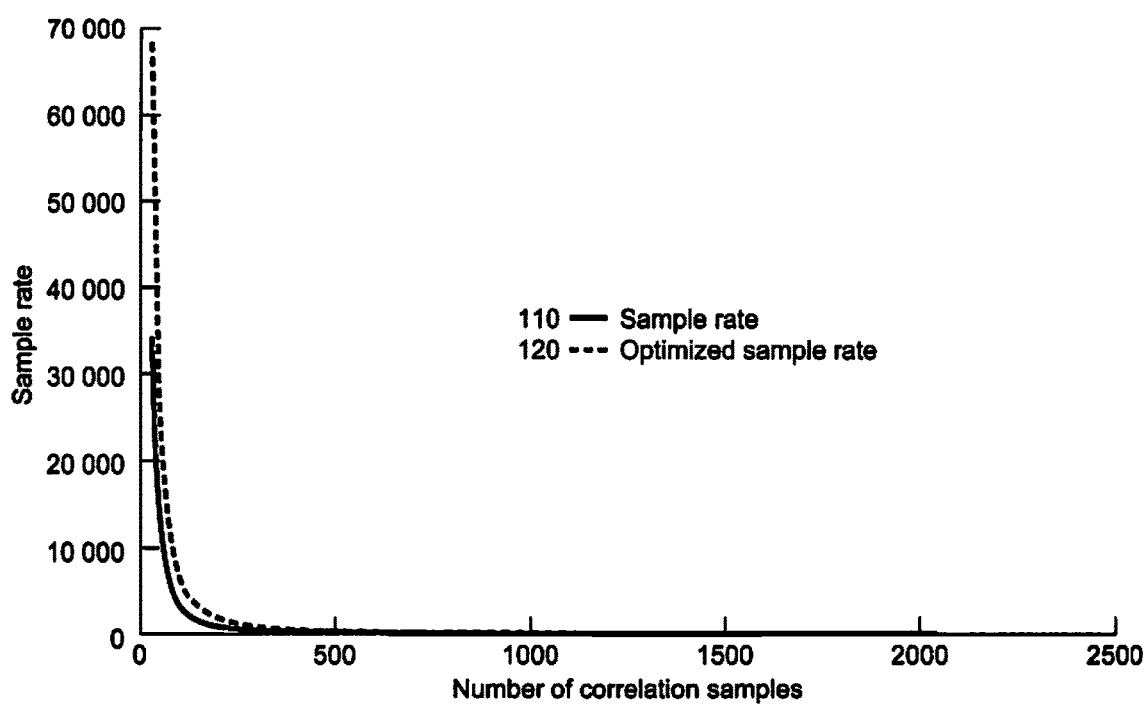
FIG. 1 is a graph illustrating sample rate versus number of correlation samples for a 70 million instructions per second (MIPS) DSP.

Some embodiments of the present invention pertain to a two input time domain correlator that performs analog correlation. In some embodiments, more than two inputs may be used and correlated, but the complexity of the hardware will increase non-linearly. In order to achieve high throughput rates with reduced or minimal computational overhead, the input data streams may be hard limited through adaptive thresholding to yield two binary bit streams. Correlation may be achieved, in part, through the use of a Hamming distance calculation, where the distance between the two bit streams approximates the time delay that separates them (i.e., a measurement approximating the similarity between the two signals).

The maximum value of this similarity calculation gives the most likely correlation between the two signals. The Hamming distance does not directly give correlation. For every new sample, the shift register of one of the channels is circularly shifted through its entire length. The Hamming distance is calculated for each shift of the shift register. Each current Hamming distance value is compared to the maximum value for the sample set. For an N-bit shift register, there will be N Hamming distances that are calculated. The maximum (of the XNOR function) gives the most similar set of values.

Such embodiments may be particularly optimized for, and beneficial for, small embedded applications that have relatively limited processing power. Such embodiments reduce the hardware requirements to perform real-time correlation of analog signals. The reduction in hardware leads to a smaller size and decreased power consumption over current digital signal processor (DSP) calculated correlations. Such an approach also increases the speed of the calculations of the correlation over those commonly done in DSPs. Lower power, mass, time to calculate, and the ability to embed hardware employing such an approach into radiation hardened and high temperature gate arrays. Such hardware may be used for the calculation of gas or fluid flow in space missions and engine combustion diagnostics and sensing, for example.

Analog Correlation

Many systems utilize the identification of a time delay to make a measurement of distance or speed. Time-of-flight ultrasonic range detectors measure the time delay from transmission to reception with a known velocity to measure distance to an object. Flow meters and sensors generally use two sensors in a flow path with a known distance between the two, measure the time delay between the arrival of a signal at each sensor, and calculate the velocity of the flow. Often, the time delay is calculated using a cross-correlation function.

Cross-correlation is a useful technique for identifying time delays between two similar signals. The cross-correlation function for continuous time signals is defined as:

$$R_{xy}(\tau) = \lim_{T \to \infty} \frac{1}{T} \int_0^T f_x(t) f_y(t+\tau) dt$$

where T is the sample period. The maximum value of $R_{xy}(\tau)$ is at a delay of $\tau$ between $f_x$ and $f_y$. While the continuous time case is useful in theory, the cross-correlation function is usually implemented in a digital discrete time sampled system. This would use the following equation:

$$R_{xy}(j) = \frac{1}{N} \sum_{n=1}^{N} f_x[n] f_y[n+j] \quad j = 0, 1, 2, \ldots, J$$

where N is the number of samples in the sample block. The previous equation defines j as the time delay in the number of sample periods, or samples, and also defines j as positive (i.e., only one direction). This may work well for a system where the signal is only expected to travel in one direction, but a more general case would be to allow j to be both positive and negative as:

$$R_{xy}(j) = \frac{1}{N} \sum_{n=1}^{N} f_x[n] f_y[n+j] \quad j = \frac{-N}{2}, \ldots, -1, 0, 1, \ldots, \frac{N}{2} - 1$$

n is the index of the summation (equivalent to t (time) in the continuous case) and j is the delay applied to the block of samples. The indexing of the $f_y$ function is (n+j) is mapped to wrap around the sample set, essentially a circular shift register of samples, so that a negative index would start at N−(n+j) and a positive index at (n+j) that would count up until reaching N. After reaching N, the index would overflow to the first sample in the block.

Performing Cross-Correlation in a DSP

Cross-correlation is typically done in a batch mode within a DSP or other processor. The two signals are sampled at the same rate for a block consisting of N samples. Then, a cross-correlation as shown above is performed on the two sets of samples. If the cross-correlation can happen fast enough, it can be accomplished between samples, allowing cross-correlation to happen in real-time. The rate at which the cross-correlation can be performed depends on number of samples (N) and the processing rate of the processor. Each cross-correlation consists of N rounds of N multiplications and N additions, or a minimum of $2N^2$ operations or instructions. This is a minimal number and does not include overhead for indexing, pointer adjustments, or other operations.

Suppose that a low cost high performance DSP microcontroller is used that is optimized for the instructions needed to perform cross-correlation. For instance, the dsPIC33 series can fetch dual operands from memory and has an onboard accumulator, which facilitates the multiplication and addition type instructions needed for performing cross-correlation to happen with a minimal amount of instructions. This particular microcontroller can operate at 70 million instructions per second (MIPS). Using the optimistic number of instructions per correlation ($2N^2$) in a microcontroller operating at 70 MIPS would allow the correlation to be run in real-time with sample rate shown in plot 110 of graph 100 in FIG. 1. In plot 120, an optimized sample rate for an optimized DSP, such as the dsPIC33, that can do a multiply and accumulate in a single instruction is shown. This effectively doubles the sample rate.

At 32 samples per correlation, the sample rate could be as high as 34,200 samples per second (SPS) and run continuously. As more samples are added to the correlation depth, the sample rate falls off dramatically due the inverse relationship:

$$\text{Sample Rate} = \frac{MIPS}{2N^2}$$

As previously stated, the above equation does not take into account any overhead for memory operations or other operations done within the microcontroller, such as outputting the data. This shows that smaller, lower cost sensor systems generally do not lend themselves to techniques that use cross-correlation to measure time delays.

One Bit Digital Correlator

Some embodiments are capable of correlating two analog signals by using an analog based signal conditioning front end to hard limit the analog signals through adaptive thresholding into a binary bit stream, then performing the correlation using a Hamming "similarity" calculator function embedded in a one bit digital correlator (OBDC). By converting the analog signal into a bit stream, the calculation of the correlation function is simplified, and less hardware resources are needed. This binary representation allows the hardware to move from a DSP, where instructions are performed serially, to digital logic where calculations can be performed in parallel, speeding up calculations significantly.

Figure 2:
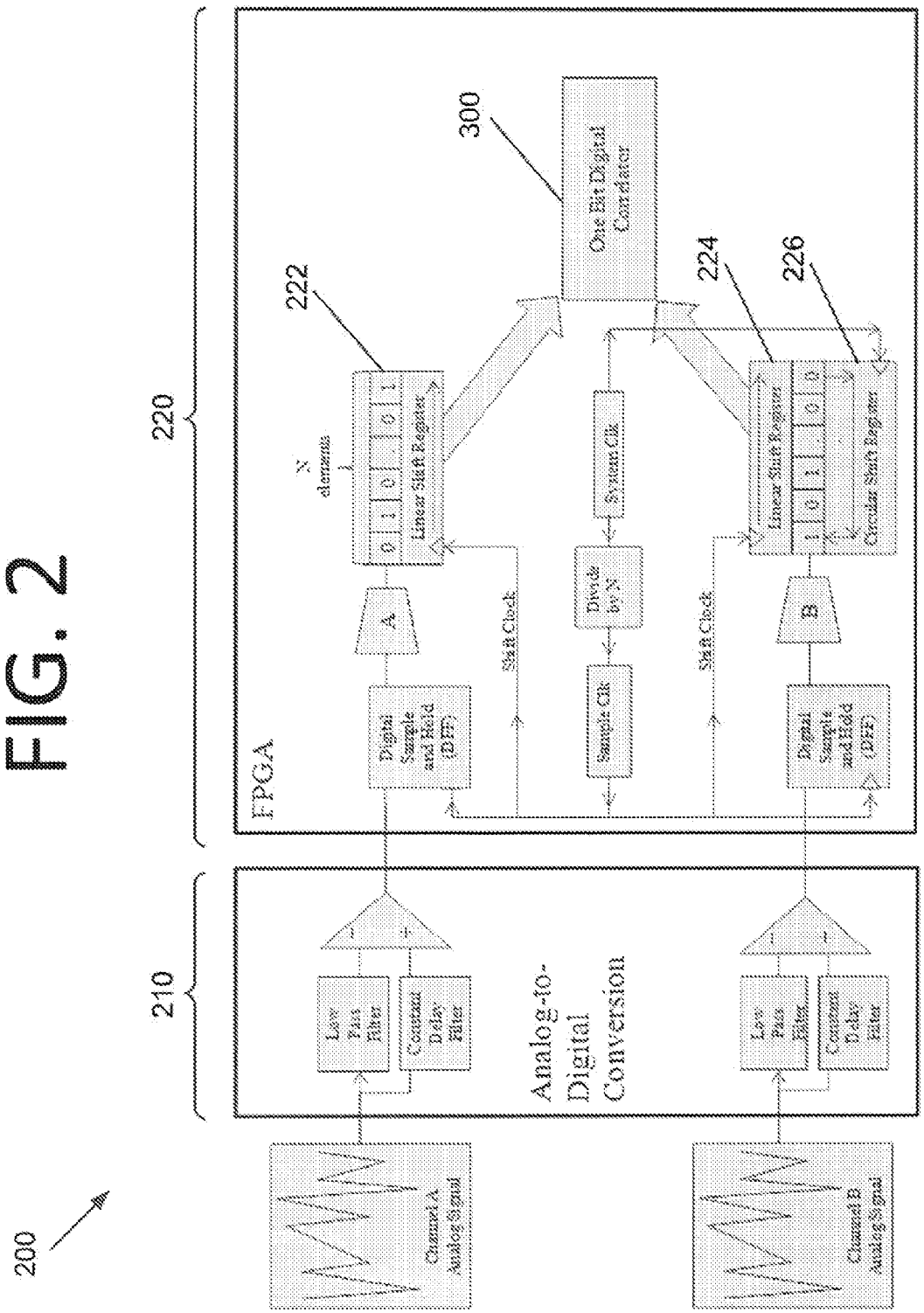
FIG. 2 illustrates a system for performing analog correlation, according to an embodiment of the present invention.

FIG. 2 illustrates a system 200 for performing analog correlation, according to an embodiment of the present invention. Each of the two analog signals (channels A and B) is converted to a digital representation using analog-to-digital conversion hardware 210 by performing a low pass filter function on the respective input signal, which effectively averages the signal, and then comparing this average value to the actual signal appropriately delayed to account for group delay within the low pass function. In either filter function, an offset may be added to dampen or heighten sensitivity to differences between the mean and actual values. This offset may be time variant to allow for adaptive thresholding. This comparison will result in a digital high or low logic level signal. Each of the digital signals (A and B) is digitally sampled with a flip flop and input into the OBDC of field programmable gate array (FPGA) 220. Comparing the delayed signals to low pass filtered versions of themselves results in the adaptive hard limiting front end function for this embodiment.

Figure 3:
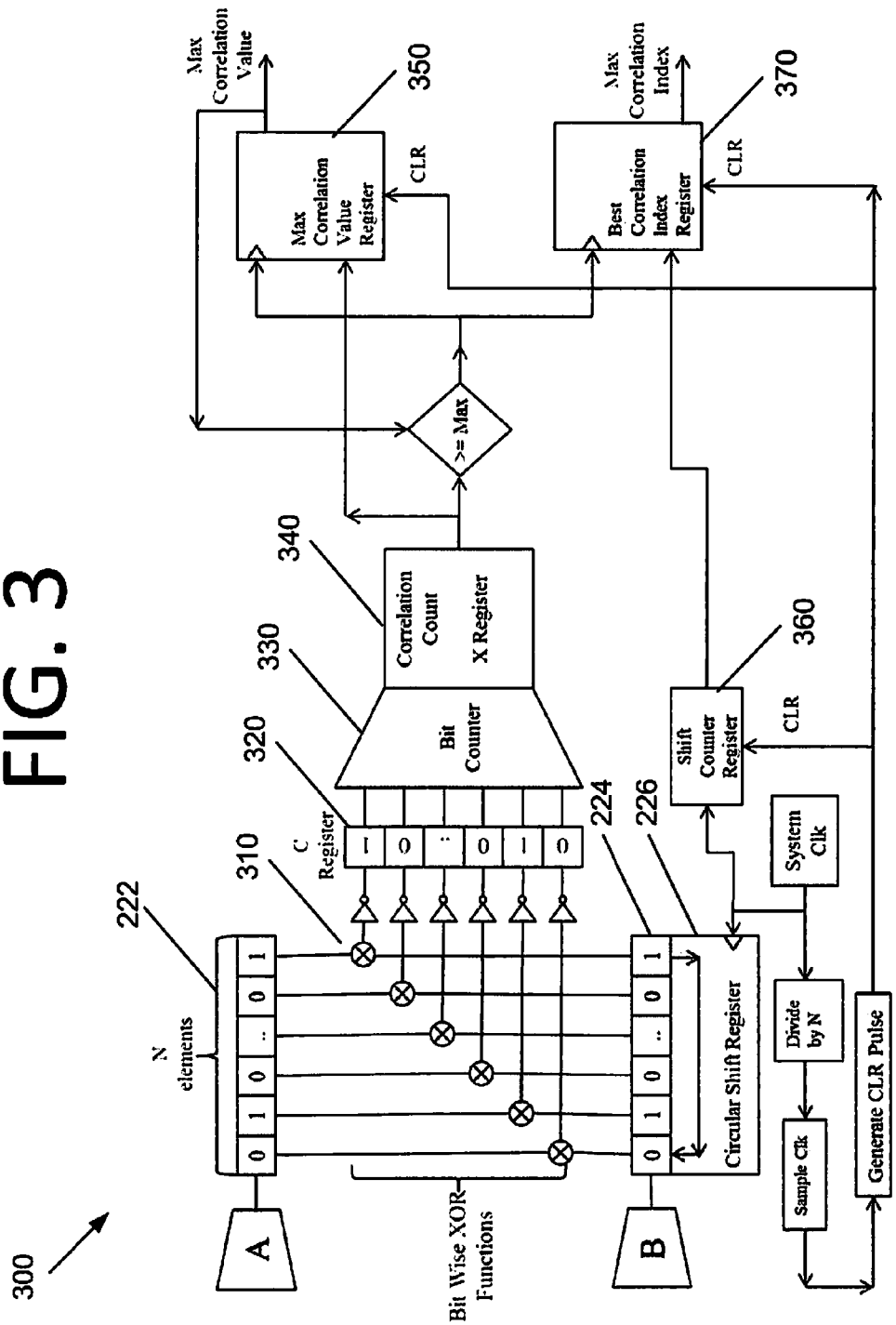
FIG. 3 illustrates a one bit digital correlator (OBDC), according to an embodiment of the present invention.

The OBDC in this embodiment, which is shown in more detail in OBDC 300 of FIG. 3, is set of digital functions embedded into FPGA 220. OBDC 300 is made up of two shift registers 222, 224 containing the current sample values of length N from each of the two input channels A and B. During each sample clock, a new sample from each of input channels A and B is clocked into the input linear shift register 222, 224 for each respective channel, and a circular shift register 226 for channel B. This input shifts the current values in the linear shift register. The oldest (N+1 sample clocks ago) sample is clocked out of the register. Once the inputs have been clocked in, the correlation routine can start. This rising edge of the sample clock also clears the max correlation value, the best correlation index, and shift counter registers 222, 224, initializing XOR gates followed by inverters 310. This creates XNOR logic. Traditionally, the Hamming distance is calculated as the number of adjacent bits in error (dissimilar state) between two aligned binary sequences of equal length. In this embodiment, the Hamming "similarity", or bits in agreement, is calculated. The Hamming distance is calculated by first performing the bitwise exclusive NOR (XNOR) function via XOR gates followed by inverters 310 on the A and B registers, and placing the result in an N length register C 320. The count of the number of bits (X) with a value of '1' or '0' in register C 320 gives the similarity between register A and B. In the case that '0' bits are counted, a low count would give a high correlation. In certain embodiments, the inverters may be removed and a high number of '0' bits, or a low number of '1' bits, would indicate high correlation. This count of similar bits is accomplished by a hardware bit counter 330. Bit counter 330 allows the bit counting to be done in parallel with no clock needed. The gate depth of bit counter 330 is the time limiting factor for this function. Collectively, XOR gates followed by inverters 310, C register 320, and bit counter 330 constitute a Hamming distance calculator.

On average, the value of the matching bits will be N/2 for a pseudo-random binary sequence in X register 340. When the two linear shift registers 222, 224 match exactly, or are correlated, the X value will equal N. Once the correlation value has been calculated, this result is forwarded to compare with max correlation value register 350. If the X value is greater than the current max correlation value, then the max correlation value becomes X, and shift counter register 360 is latched and put into best correlation index register 370, providing the index of the current best correlation.

The correlation index is the number of sample clocks difference between the two input signals. To account for time delays between the A and B sequences of bits, the B register is circularly shifted once and the process is begun again. This XNOR, count, compare, latch, and shift sequence is repeated N times between each input sample. At the end of the N times, the B register has been cycled completely through and ends up at its initial state, the best correlation index register 370 contains the number for the delay time in the number of sample clocks, and the value in X register 340 contains the correlation value.

If the A and B registers could be exactly correlated, X would contain the value N. In practice, a time delay will present an X value of less than N, but close. This is due to the delay needed for correlation and may not be an exact multiple of the sample clock. This potential lack of matching allows the max correlation to overlap into two consecutive numbers of shifts. The max correlation value can be monitored and will give a strength or confidence in the correlation. The max correlation value can be used to dither the sample clock or adapt the threshold in real-time. Once the best correlation index and best count X are output, a new sample is sampled and clocked into the A and B registers and the entire sequence is performed again.

Figure 4:
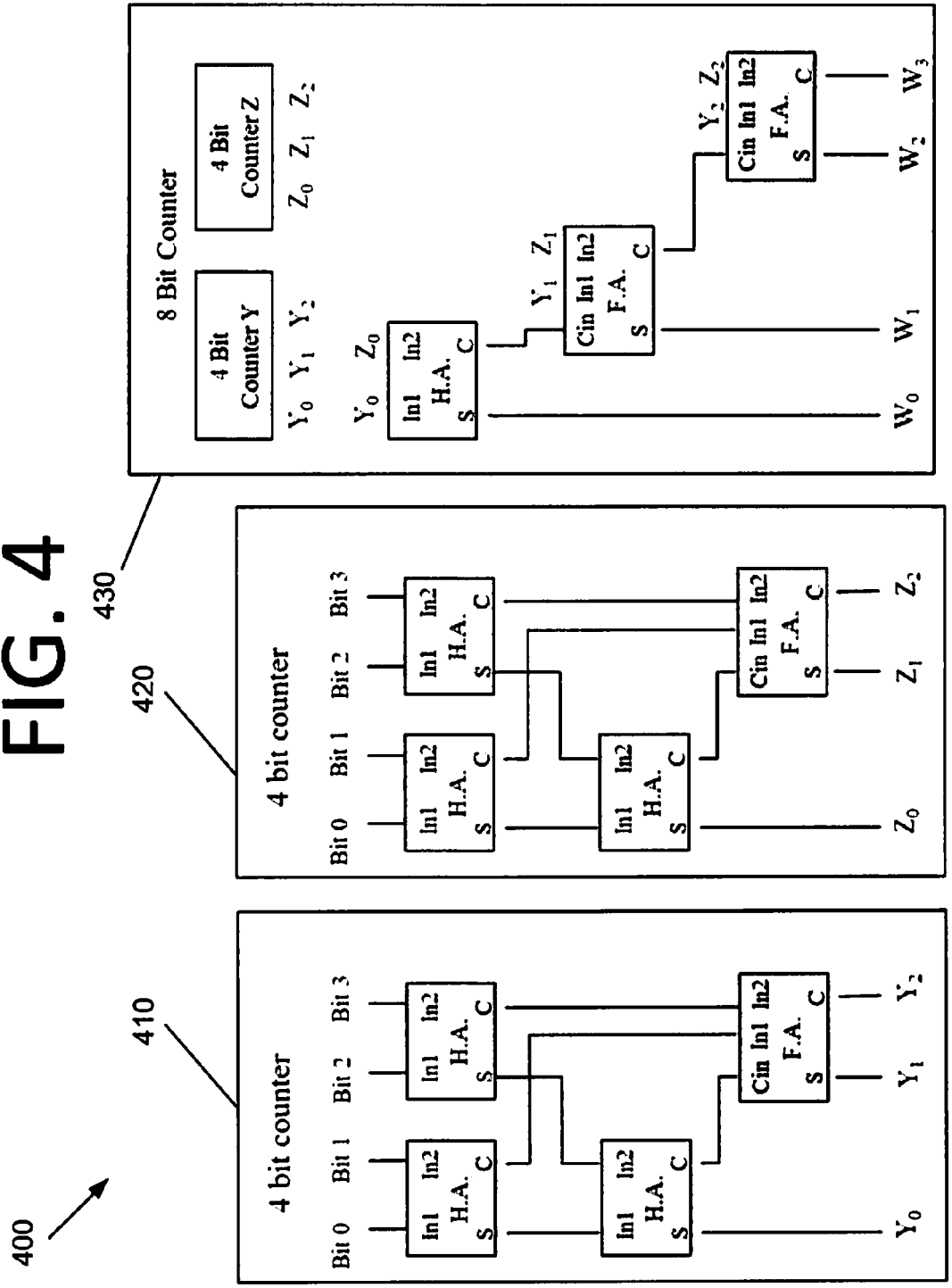
FIG. 4 illustrates a bit counter, according to an embodiment of the present invention.
Figure 5:
FIG. 5 illustrates numerical requirements for half adders and full adders for a bit counter of 2-N bits, according to an embodiment of the present invention.

FIG. 4 illustrates a bit counter 400, according to an embodiment of the present invention. In some embodiments, bit counter 400 may be bit counter 330 of FIG. 3. Bit counter 400 counts the number '1' or '0' values present in a shift register, depending on the implementation. This counting should be done in parallel without a clocking signal so that it may be accomplished in between system clocks. Bit counter 400 makes use of ripple counters. Two 4-bit counters 410, 420 and one 8-bit counter 430 are used. In depicted bit counter 400, each 4-bit counter 410, 420 has three half adders (HAs) and a full adder (FA). 8-bit counter 430 has a HA and two FAs. The outputs of 4-bit counters 410, 420 are fed into 8-bit counter 430. Two 8-bit counters could then be combined to form a 16-bit counter by adding one additional HA and $\log_2(16)-1$ (i.e., 3) FAs in the same logical manner as done in 8-bit counter 430. This process can be repeated, doubling the number of bits each time, until the counter logic delay is greater than the system clock period. See numerical requirements 500 for HAs and FAs for a bit counter of 2-N bits in FIG. 5.

Other adders of fixed length may also be used in the bit counter. Embodiments of such bit counters, in essence, may function as a "ones adder" circuit configured to take any scrambled N bit unary-weighted binary input word and output a count equal to a number of '1s' present in the word. However, as discussed above, '0s' may be counted in lieu of '1s' in some embodiments.

Figure 6:
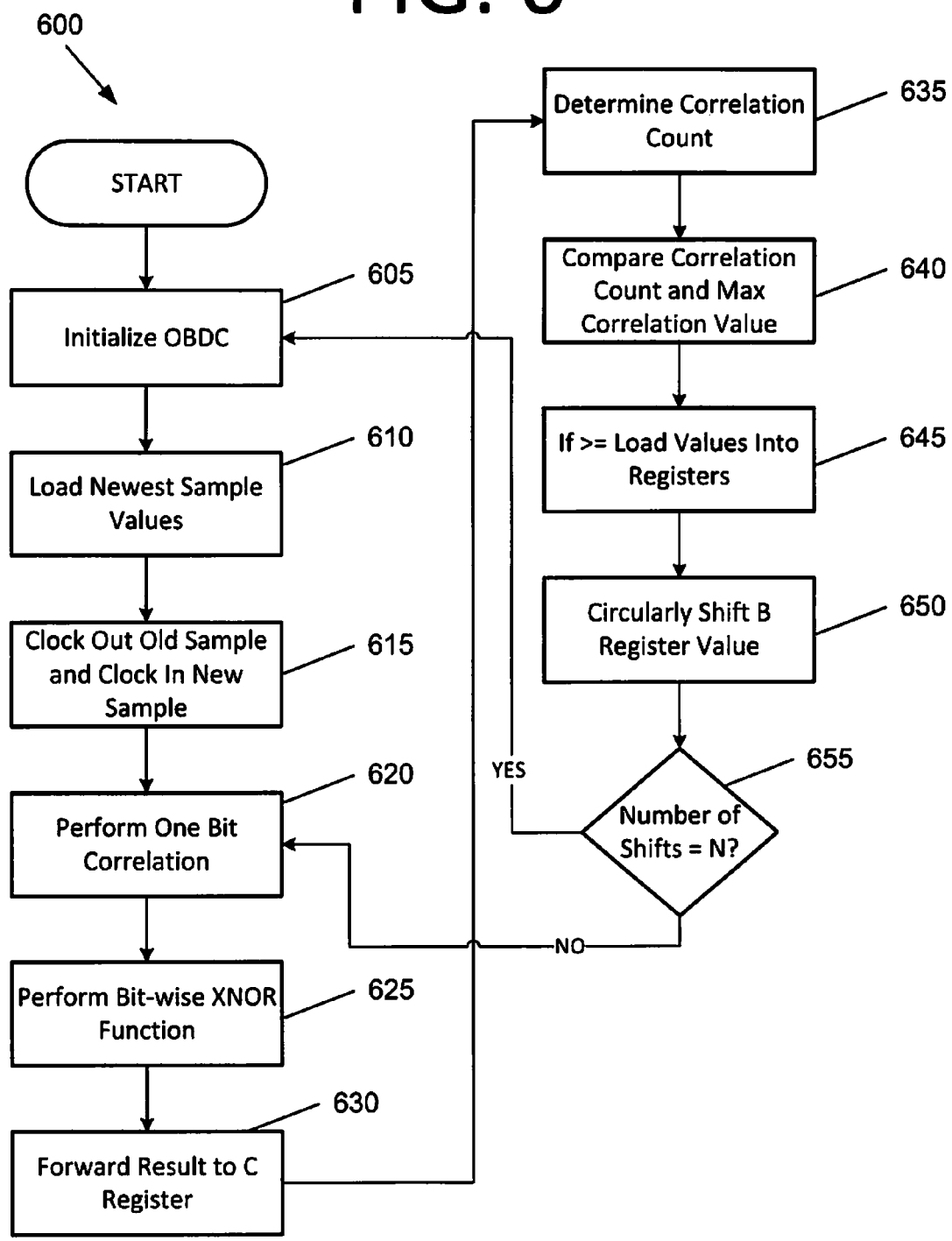
FIG. 6 is a flowchart illustrating a method for performing the functions of an OBDC, according to an embodiment of the present invention.

The OBDC digital functions can also be thought of as a finite state machine performing the steps illustrated in flowchart 600 of FIG. 6. The method begins at 605 with, at the sample clock, initializing the OBDC by clearing the max correlation value, max correlation index, and shift counter registers. Next, the newest sample values from the A and B channels are loaded into each channel's respective linear shift register at 610. Oldest sample is clocked out of the register as the new sample is clocked in at 615.

For N times, one bit correlation is performed at 620. A bit-wise XNOR function is performed on the A register and the circularly shifted B register at 625, and the result is forwarded to the C register at 630. The number of '1' valued bits in the C register is counted and this result is put into the correlation count X register at 635. This function is performed by the bit counter. Steps 625, 630, and 635 make up the one bit correlation of 620.

The correlation count is compared to the value in the max correlation value register at 640. If the value is greater than or equal to, then the value of the shift count register is loaded into the best correlation index register and the correlation count value is loaded into the max correlation value register at 645. Steps 640 and 645 track the correlation results to determine the maximum value and index of maximum value for correlation. Steps 640 and 645 are executed after each correlation.

The value in the B register is circularly shifted by one bit at 650. After the $N^{th}$ iteration, the value in B will be the same as the first iteration. The value in the best correlation index register will contain the number of sample clock delays that give the best correlation between the A and B channels. The value in the max correlation value register will contain a value corresponding to how great the correlation is between A and B at the specific time delayed version given by the index. If the number of shifts is equal to N at 655, the process then returns to 605 to initialize the OBDC. The process proceeds to step 620 otherwise. Alternatively, the entire process may end if there are no more samples to correlate (e.g., the sensor system is shut down).

It will be readily understood that the components of various embodiments of the present invention, as generally described and illustrated in the figures herein, may be arranged and designed in a wide variety of different configurations. Thus, the detailed description of the embodiments of the systems, apparatuses, methods, and computer programs of the present invention, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. A hardware-implemented method, comprising:
    loading, by a processor, newest sample values from two channels into each channel's respective linear shift register, A and B;
    clocking out, by the processor, an oldest sample from each of the linear shift registers and clocking in the newest sample value; and
    performing, by the processor, N one bit correlations between the linear shift registers, each followed by circularly shifting one of the registers by one bit, wherein N is the bit length of the shift registers.

2. The hardware-implemented method of claim 1, further comprising:
    performing the N one bit correlation between the linear shift registers with a one bit g digital correlator (OBDC) comprised of:

a max correlation value register to hold the numerical value of the strength of correlation between the bit streams contained in the two channels;

a max correlation index register to hold the location along the length of the linear shift registers of the peak correlation; and one or more shift counter registers to hold the current of the number of shift operation;

each of the one bit digital correlator (OBDC) registers initialized at the start of operation to zero by the processor.

3. The hardware-implemented method of claim 2, further comprising:

for each of the N one bit correlations performed by the one bit digital correlator (OBDC), a bit-wise XNOR function between the A register and the B register and forwarding that result from the bit-wise XNOR function to a C register;

wherein the N one bit correlations by the one bit digital correlator (OBDC) are performed after each of the N single bit shifts of the B register.

4. The hardware-implemented method of claim 3, further comprising:

counting, by the one bit digital correlator (OBDC), a number of same valued bits in the C register to determine a correlation count and putting that result into a correlation count X register.

5. The hardware-implemented method of claim 4, further comprising:

comparing, by the one bit digital correlator (OBDC), the correlation count X register value to a value in the max correlation value register.

6. The hardware-implemented method of claim 5, wherein when the value of the correlation count X register value is greater than or equal to the value in the max correlation register, the method further comprises:

loading, by the one bit digital correlator (OBDC), a value of the shift counter register into the max correlation index register and loading the value in the correlation count X register into the max correlation value register.

7. The hardware-implemented method of claim 1, further comprising:

circularly shifting, by the processor, the value in the B register by one bit.

8. The hardware-implemented method of claim 1, further comprising:

hard limiting input data streams for the two channels through adaptive thresholding to yield two binary bit streams to be loaded into the linear shift registers A and B as new sample values at each clock by performing a low pass filter function on the respective input data streams and then comparing a low pass filter function output value to an actual signal appropriately delayed to account for group delay within the low pass function.

9. An apparatus, comprising:

one linear shift register A and one circular shift register B configured to receive two different time delayed signals; and a Hamming distance calculator configured to calculate a Hamming distance by performing a bitwise exclusive NOR (XNOR) function on the A and B registers and place a result having a number of bits N of the A and B registers in a C register; and a bit counter configured to count a number of bits with a same value in the C register to determine a Hamming similarity between registers A and B.

10. The apparatus of claim 9, wherein the linear and circular shift registers are configured to clock out an oldest sample during each sample clock.

11. The apparatus of claim 9, further comprising:

a max correlation value register;

a max correlation index register; and a shift counter register, wherein the apparatus is configured to clear one or more values of the max correlation value register, the max correlation index register, and the shift counter register on a rising clock edge.

12. The apparatus of claim 11, wherein the apparatus is further configured to compare a correlation value with the value in the max correlation value register.

13. The apparatus of claim 12, wherein, when the correlation value is greater than or equal to the max correlation register value, the apparatus is configured to set the max correlation register value to the correlation value.

14. The apparatus of claim 13, wherein the apparatus is configured to latch the shift counter register and put the shift counter register value into the max correlation index register.

15. The apparatus of claim 14, wherein the apparatus is configured to circularly shift the B register to account for time delays between sequences of bits for registers A and B.

16. The apparatus of claim 15, wherein after a number of cycles of a length of the A and B registers, the max correlation index register contains a number for a delay time in a number of sample clocks, and a value in an X register contains a correlation value.

17. The apparatus of claim 9, further comprising:

analog-to-digital conversion hardware configured to hard limit the two different time delayed signals through adaptive thresholding to yield two binary bit streams by performing a low pass filter function on the respective input data streams and then comparing a low pass value to an actual signal appropriately delayed to account for group delay within the low pass function.

* * * * *